(12) United States Patent
Pokorny

(10) Patent No.: US 7,478,348 B2
(45) Date of Patent: Jan. 13, 2009

(54) METHOD AND APPARATUS OF RAPID DETERMINATION OF PROBLEMATIC AREAS IN VLSI LAYOUT BY ORIENTED SLIVER SAMPLING

(75) Inventor: William F. Pokorny, Mansfield, PA (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 11/277,532

(22) Filed: Mar. 27, 2006

(65) Prior Publication Data

US 2007/0226662 A1 Sep. 27, 2007

(51) Int. Cl.
*G06F 17/50* (2006.01)
(52) U.S. Cl. ............................................ 716/5; 716/4
(58) Field of Classification Search ........................ None
See application file for complete search history.

(56) References Cited

U.S. PATENT DOCUMENTS

| | | | |
|---|---|---|---|
| 5,673,201 A | * | 9/1997 | Malm et al. .................... 716/12 |
| 6,066,179 A | | 5/2000 | Allan |
| 6,301,689 B1 | | 10/2001 | Darden |
| 6,505,325 B1 | | 1/2003 | Hamamoto |
| 6,505,334 B1 | * | 1/2003 | Tanaka ......................... 716/13 |
| 6,779,165 B2 | * | 8/2004 | Darden ......................... 716/12 |
| 6,901,566 B2 | | 5/2005 | Mizumasa |
| 2001/0042236 A1 | | 11/2001 | Darden |
| 2004/0199886 A1 | | 10/2004 | Liang et al. |

* cited by examiner

*Primary Examiner*—Leigh Marie Garbowski
(74) *Attorney, Agent, or Firm*—Richard M. Kotulak; Greenblum & Bernstein P.L.C.

(57) ABSTRACT

A method and system for identifying problematic areas in a very large scale integrated (VLSI) layout. The method and system includes defining one or more sample area and overlaying the one or more sample area onto at least a portion of a layout having a plurality of structures. The method and system includes identifying at least one region of the layout in the sample area which has at least one structure which satisfies a predetermined value. In embodiments, the method and system can be implemented on a computer program product comprising a computer useable medium including a computer readable program.

20 Claims, 10 Drawing Sheets

Sliver Pattern

METHOD AND APPARATUS OF RAPID DETERMINATION OF PROBLEMATIC AREAS IN VLSI LAYOUT BY ORIENTED SLIVER SAMPLING

FIELD OF THE INVENTION

The invention relates to a method and system for determining problematic regions in a circuit layout, and more particularly to a method and system of rapid determination of wide wires (or other problematic areas) in a circuit layout by using oriented sliver sampling.

BACKGROUND DESCRIPTION

Integrated circuits and their physical packaging are described by physical designs in the form of hierarchical 2-dimensional geometric models. The increasing data volume accomplished by the ever increasing complexity of these designs is becoming a significant problem for engineering design automation, since it overstresses the software design tools which in turn impact the design cycle time, design cost and time to market.

Physical design data is analyzed many times to verify that physical mask constraints are not exceeded, electrical performance is satisfactory, and the physical design implements the logical design intent. For example, it is often necessary to determine wide or fat portions of material in a very large scale integrated (VLSI) semiconductor mask layout for the purposes of design rule checking (DRC), data preparation prior to mask build and the like. This determination is problematic with modern hierarchical tools because the area around the base shape or cell which must be searched is large causing the effective flattening of the layout many times over. Thus, vast CPU and memory resources are consumed in the process and often for little real value as there are rarely many shapes which are wide, in the end.

In conventional methods, the standard approach to managing increasing design complexity has been to optimize the hierarchical design itself, as opposed to checking the design in flattened form. However, the conventional design verification methodology suffers from several problems. The computation of the high level representation of the physical partitions can be a significant problem when the data volume in a partition is substantial. Unfortunately, the addition of high level representation cells to the design increases the complexity still further. Moreover, any attempt to break the hierarchical design constraints using ad-hoc design fixes invalidates the integrity of the hierarchical partitioning and reduces the verification process to a completely flat analysis problem. Finally, the methodology constraints typically prevent the designer from fully exploiting the available density offered by the physical design technology.

SUMMARY OF THE INVENTION

In a first aspect of the invention, a method of identifying areas in VLSI (very large scale integrated) layout comprises defining one or more sample area, and overlaying the one or more sample area onto at least a portion of a layout having a plurality of structures in a first direction. The method further includes identifying at least one region of the layout in the sample area which has at least one structure which satisfies a predetermined value.

In another aspect of the invention, the method includes generating at least one sampling sliver for each mask layer in question. The method further includes overlaying the at least one sampling sliver over each mask layer in question and obtaining a result from each generated sampling sliver. The result may be used to identify whether a potential problematic area exists on the each mask layer.

In yet another aspect of the invention, a system comprises a module for defining one or more sample area of a predetermined width and spacing. The spacing is not to exceed a design parameter. The system further includes a module for overlaying the one or more sample area onto at least a portion of a layout having a plurality of structures, and identifying at least one region of the layout in the sample area which has at least one structure which satisfies a predetermined value. In embodiments, the defining, overlaying and identifying may be implemented on a computer program product comprising a computer useable medium including a computer readable program.

DETAILED DESCRIPTION OF EMBODIMENTS OF THE INVENTION

The invention relates to a method and system for determining wide wires in a circuit layout, and more particularly to a method and system of rapid determination of wide wires in a circuit layout by oriented sliver sampling. In embodiments, sampling slivers are generated perpendicular to a preferred direction for a mask level such that the slivers are intersected with the wiring shapes for a given mask level. Utilizing the system and method of the invention, a potential wide region of material can be found where the length of the least enclosing rectangle for any intersection of sliver and shape is greater than or equal to a predetermined ratio (e.g., (width in question)/1.5). Further resources can be expanded around these regions to determine the exact dimensions of the wide region of material.

The method of the invention was found to be at least two orders of magnitude faster than known methods on several parts. Further the method of the invention also lends itself well to parallel computation with about another 4x increase in turn around time realized, compared to known methods.

Figure 1:
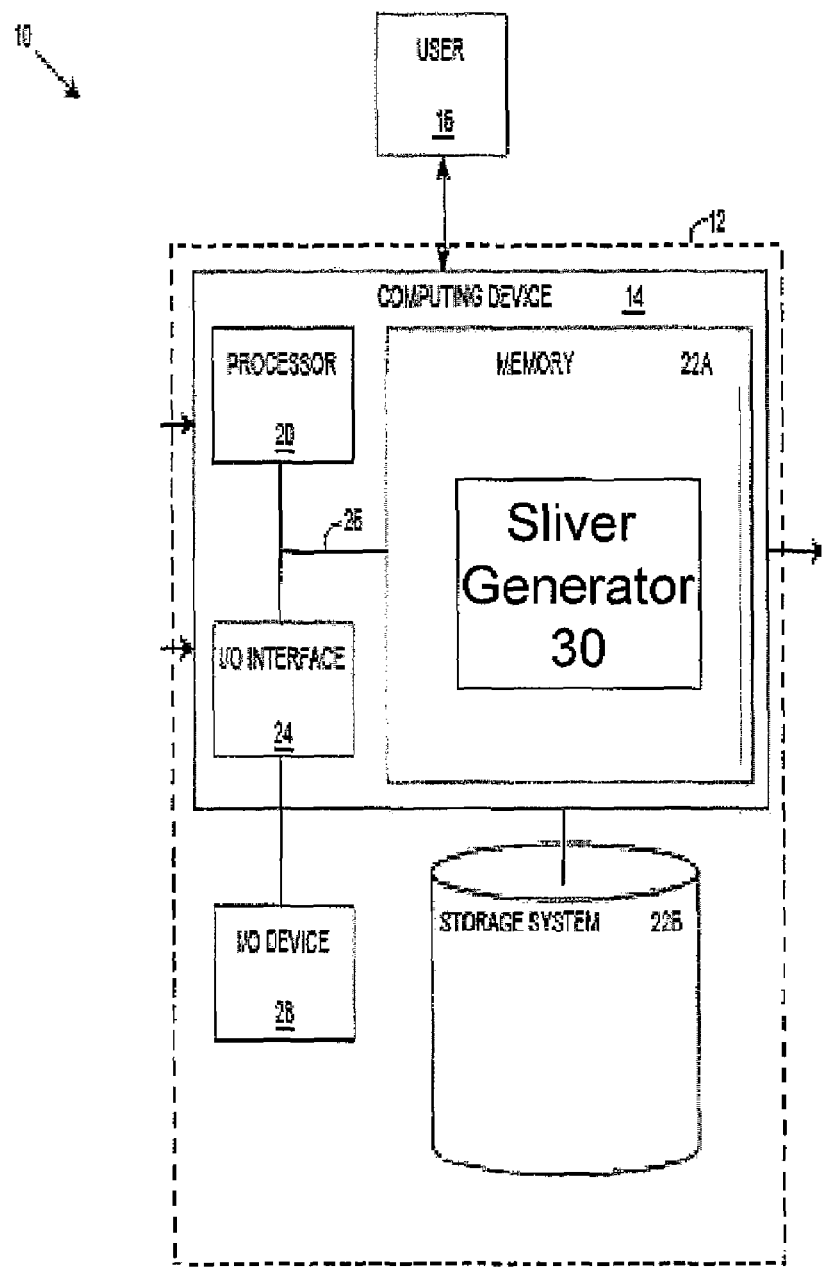
FIG. 1 is representative of a system implementing the invention.
Figure 1:
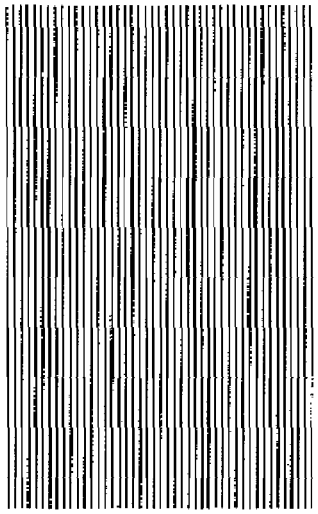

FIG. 1 shows an illustrative environment 10 for managing and applying the processes in accordance with the invention. To this extent, the environment 10 includes a computer infrastructure 12 that can perform the processes described herein. In particular, the computer infrastructure 12 is shown including a computing device 14 that comprises a sliver generator 30, which makes computing device 14 operable to perform the process described herein. The computing device 14 is shown including a processor 20, a memory 22A, an input/output (I/O) interface 24, and a bus 26. Further, the computing device 14 is shown in communication with an external I/O device/resource 28 and a storage system 22B. As is known in the art, in general, the processor 20 executes computer program code, which is stored in memory 22A and/or storage system 22B. While executing computer program code, the processor 20 can read and/or write data, such as the required information to generate the slivers for different layouts, in accordance with the invention, to/from memory 22A, storage system 22B, and/or I/O interface 24. The computing device can also overlay this sliver pattern onto a layout and identify certain potentially problematic areas, in accordance with the invention, as described in more detail below. The bus 26 provides a communications link between each of the components in the computing device 14. The I/O device 28 can comprise any device that enables an individual to interact with the computing device 14 or any device that enables the computing device 14 to communicate with one or more other computing devices using any type of communications link.

In any event, the computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in other embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Additionally, the method as described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
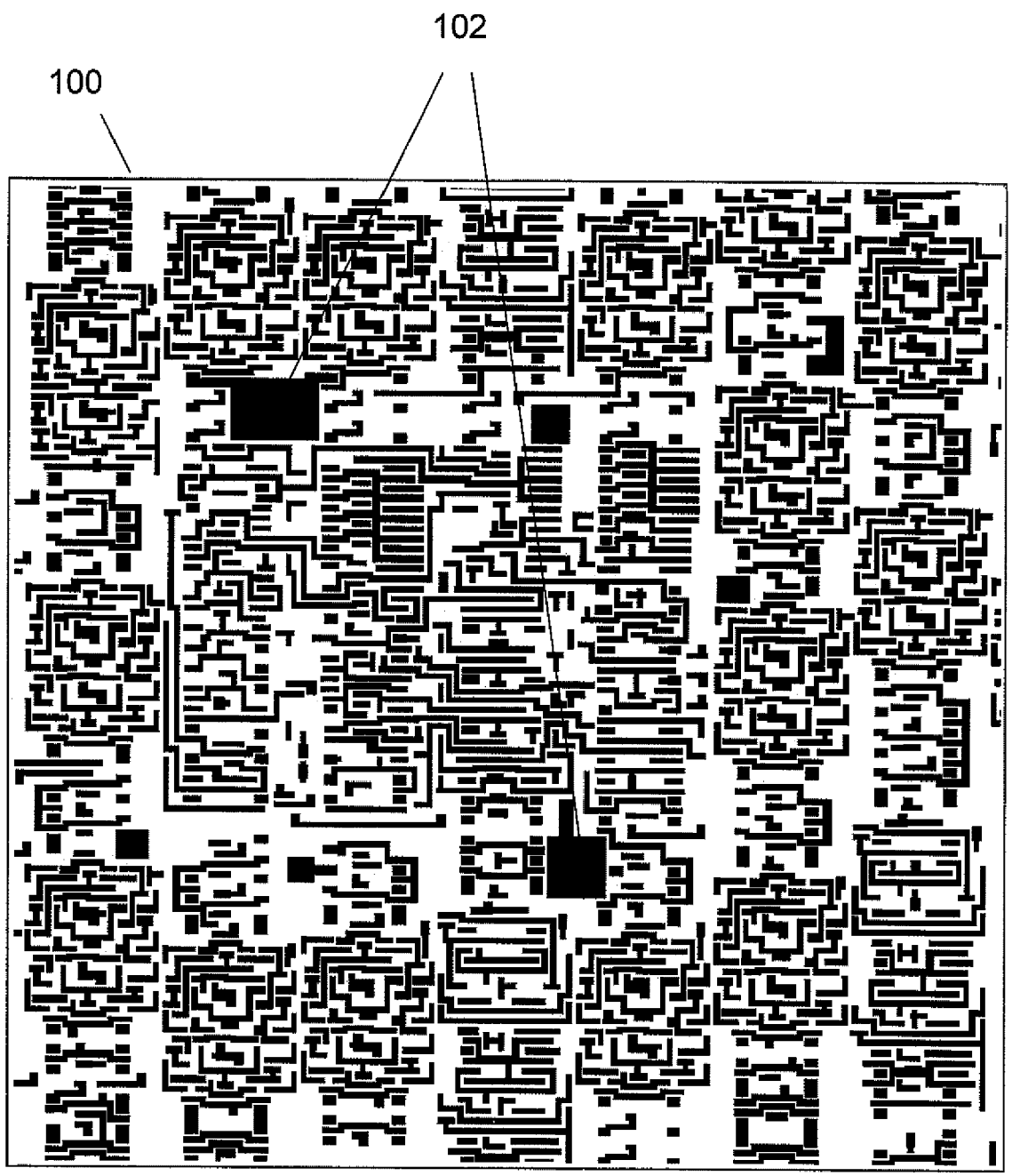
FIG. 2 shows an exemplary circuit layout.

FIG. 2 shows an exemplary circuit layout which may be used for implementing aspects of the invention. The circuit layout (wiring layout) 100 of FIG. 2 is provided as an illustrative example. Accordingly, it should be understood by those of ordinary skill in the art that other circuit layouts can also be used to implement the invention. In the exemplary circuit layout 100, wide areas or wires 102 are shown; although these can also be representative of other problematic areas. In implementation, the wide areas or wires may be identified by using the sampling of the invention.

Figure 3:
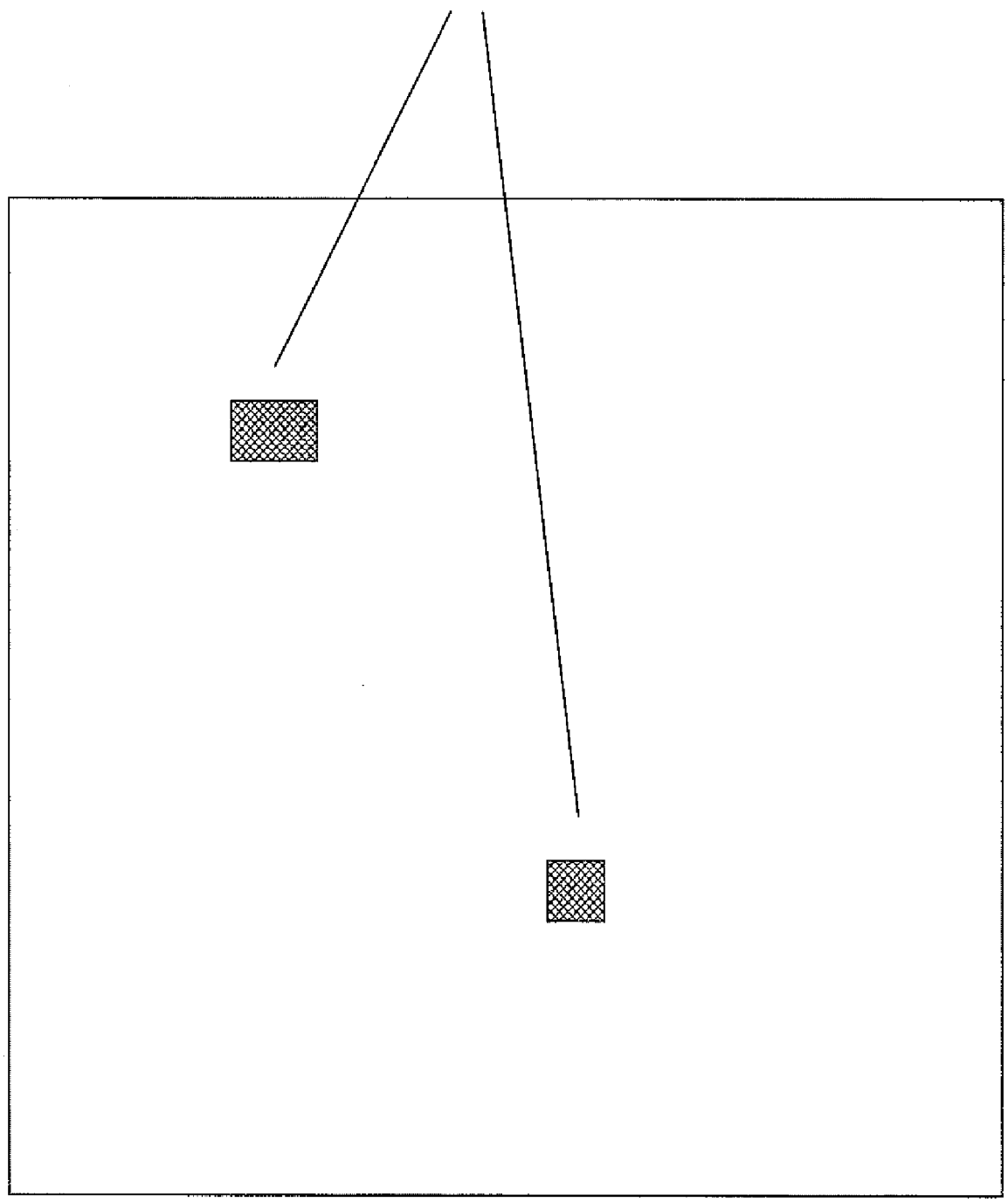
FIG. 3 shows problematic regions on the exemplary circuit layout of FIG. 2.

FIG. 3 shows the problematic regions of the exemplary circuit layout 100 of FIG. 2. In particular, problematic regions are represented generally as reference numeral 104; although is should be understood by those of skill in the art that more or less than two regions can be etched onto the circuit layout 100. In embodiments, the problematic regions 104 may be areas of excess material (e.g. wide wires, devices, etc.) or minimal material (e.g. voids, open areas, unused areas) in a very large scale integrated (VLSI) semiconductor mask layout.

Figure 4:
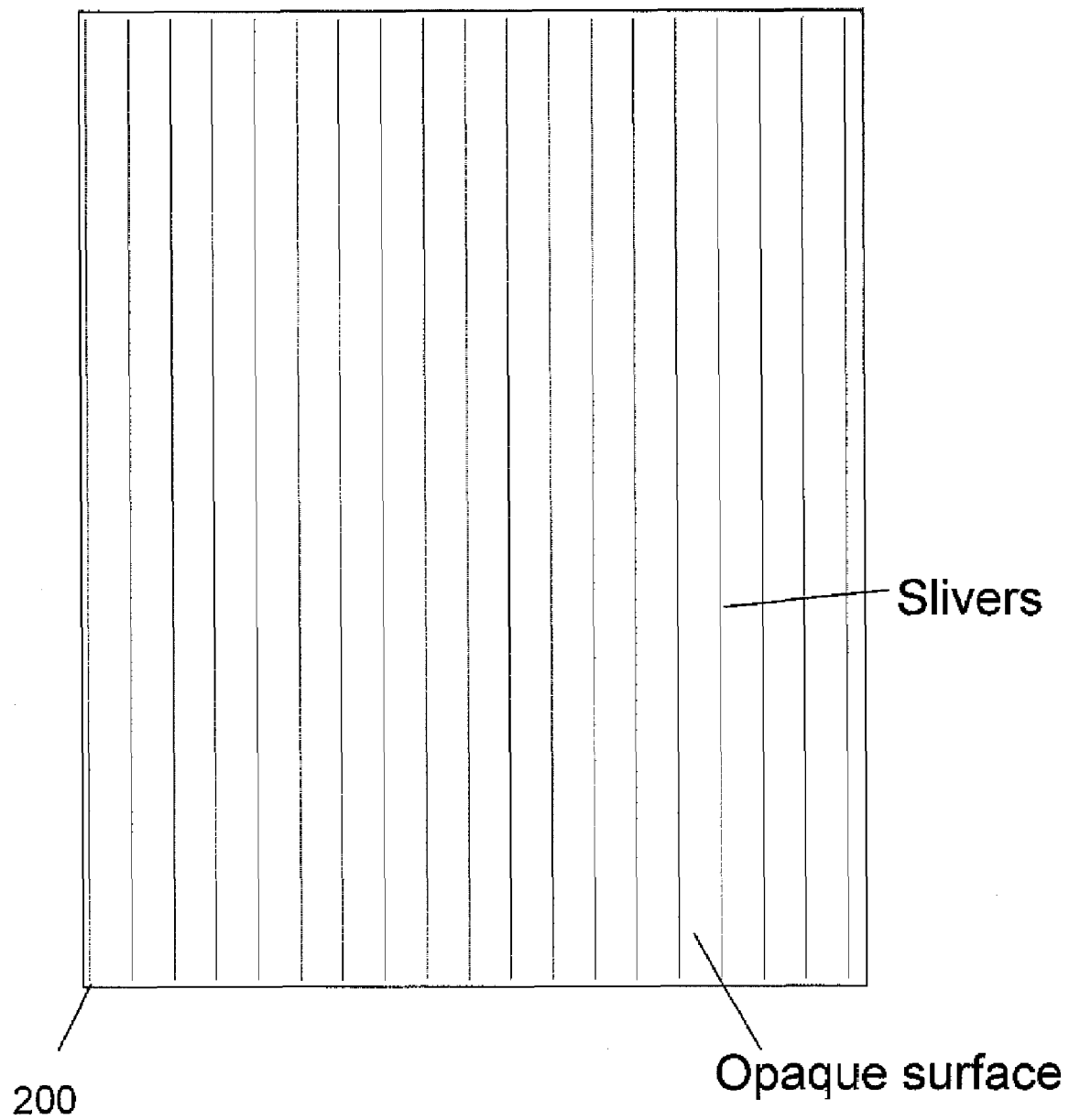
FIG. 4 shows a sliver pattern used in accordance with the invention.
Figure 5:
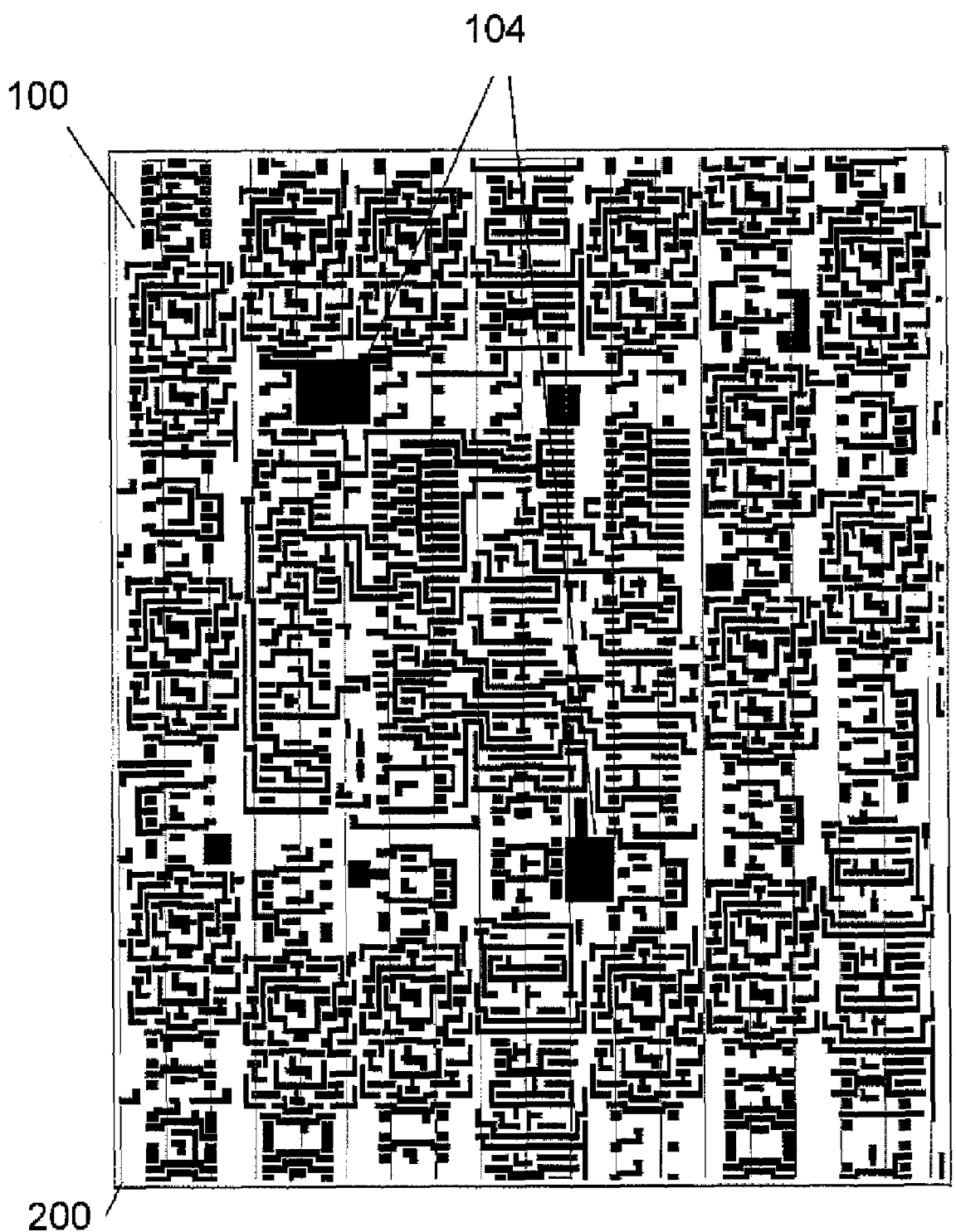
FIG. 5 shows the sliver pattern of FIG. 4 overlaid on the exemplary circuit layout of FIG. 2.

FIG. 4 shows a sliver pattern used in accordance with the invention. In embodiments, the sliver pattern is provided on an opaque surface such that when the pattern is overlaid on the circuit, only shapes of interest are shown. In embodiments, the system and method selects a sample size area or region, called a sliver 200, and overlays the area onto the layout at a given mask level such as shown in FIG. 5.

In embodiments, the slivers 200 are typically long, thin, and "cut" or intersect the layout in thin slices (at a user defined width, e.g., typically 4 design units). It should be understood that the system and method of the invention can also implement other samplings shapes such as, for example, a region or rectangle. In embodiments, the slivers are spaced at a predetermined distance from one another and preferably the desired feature size divided by the square root of two which is to be found. In embodiments, the slivers 200 may be colored (e.g., red lines) or translucent. The slivers 200 are arranged in a contiguous manner over the design such that they run, in embodiments, perpendicular to the preferred direction of that mask level. The slivers 200 can cover the entire chip or sub-regions of a chip, and are used as sampling areas.

Shapes that are larger than a given threshold are identified as being potential problems and are chosen for further analysis. Those shapes that are within tolerance are not included in the additional analysis. The shapes for further analysis are shown representatively as reference numeral 104 (FIG. 5). In implementation, due the highly asymmetric sampling, a situation arises where one orientation will present all edges at once while the other only a few at a time. The edges will be presented to a standard shapes algorithm, known to those of skill in the art. The first will typically run two orders of magnitude or more slowly than the latter orientation.

In implementation, the method and system analyzes each of the shapes (e.g., cell, wire, block, n-well, p-well) in the design according to their intersections with the slivers 200. In embodiments, the slivers can be implemented with multiple shape engines utilizing multiple (sub) simulations thus increasing the overall processing performance for finding problematic regions, as compared to conventional systems and methods. Thus, by example, it is possible to have multiple slivers with multiple processes working synchronously.

In a further implementation, it is the filtered pattern edges that present the orientation issue for geometric algorithms—scan line or other edge order sensitive algorithms used to evaluate the shape cuts or intersections with the slivers. As should now be understood, it can be thought of as the difference between looking at the shape fragments seen through the slits broadside to the slit instead of evaluating the shape fragments working from one end of the slit to the other. In the first scenario, the shapes and edges are all seen at almost the same time and in the latter only a few at a time. This reorientation or rotation for algorithmic performance may happen ahead of the intersection of the sliver shapes with the mask shapes.

Figure 6:
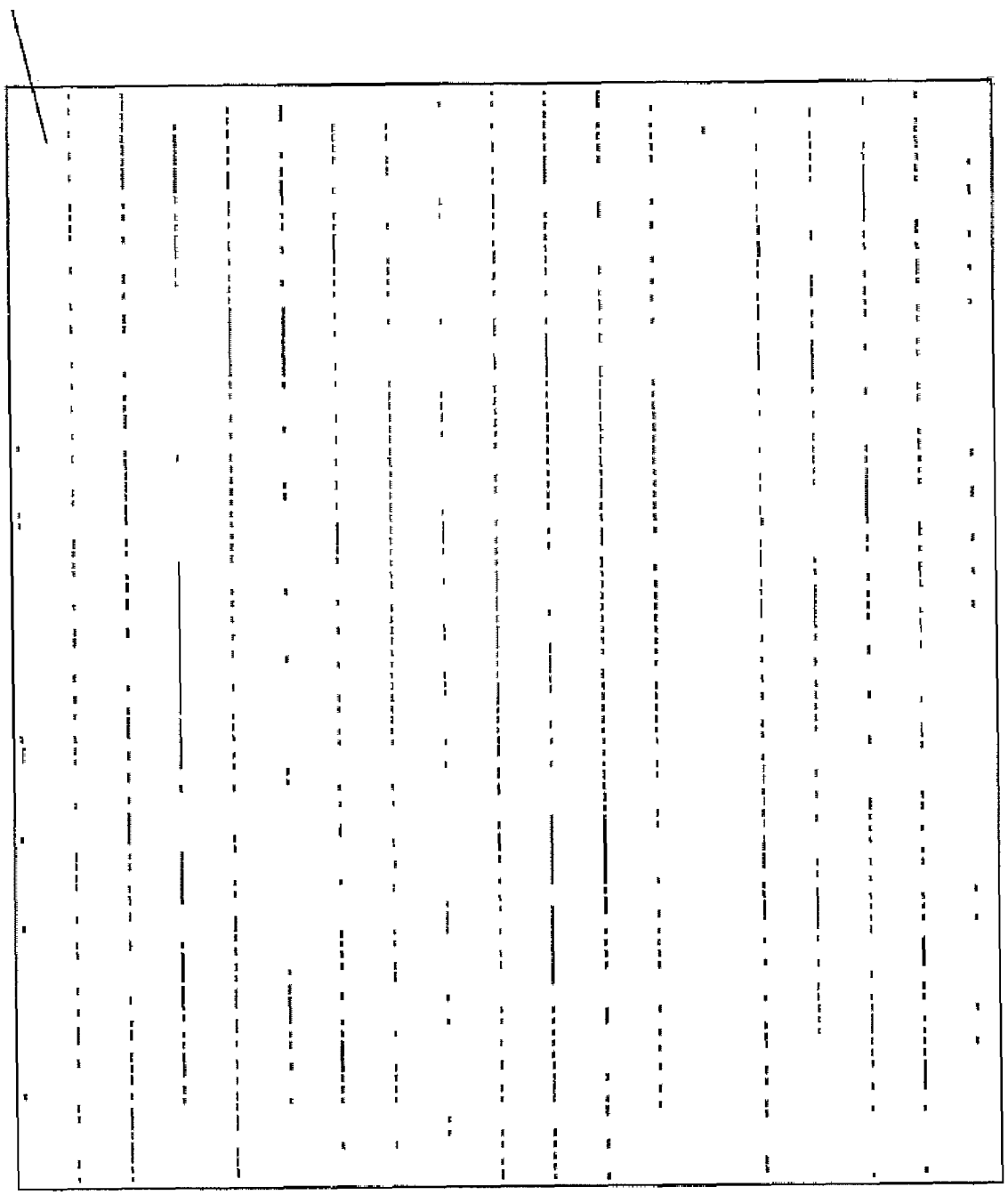
FIG. 6 shows a filtered pattern resulting from an implementation of the invention.

FIG. 6 shows a filtered pattern resulting from an implementation of the invention. This pattern is shown representatively as reference numeral 106. The pattern as shown in FIG. 6 (as well as in other layouts implementing the invention) results from the sliver spacing and opaque field of the sliver pattern.

Figure 7:
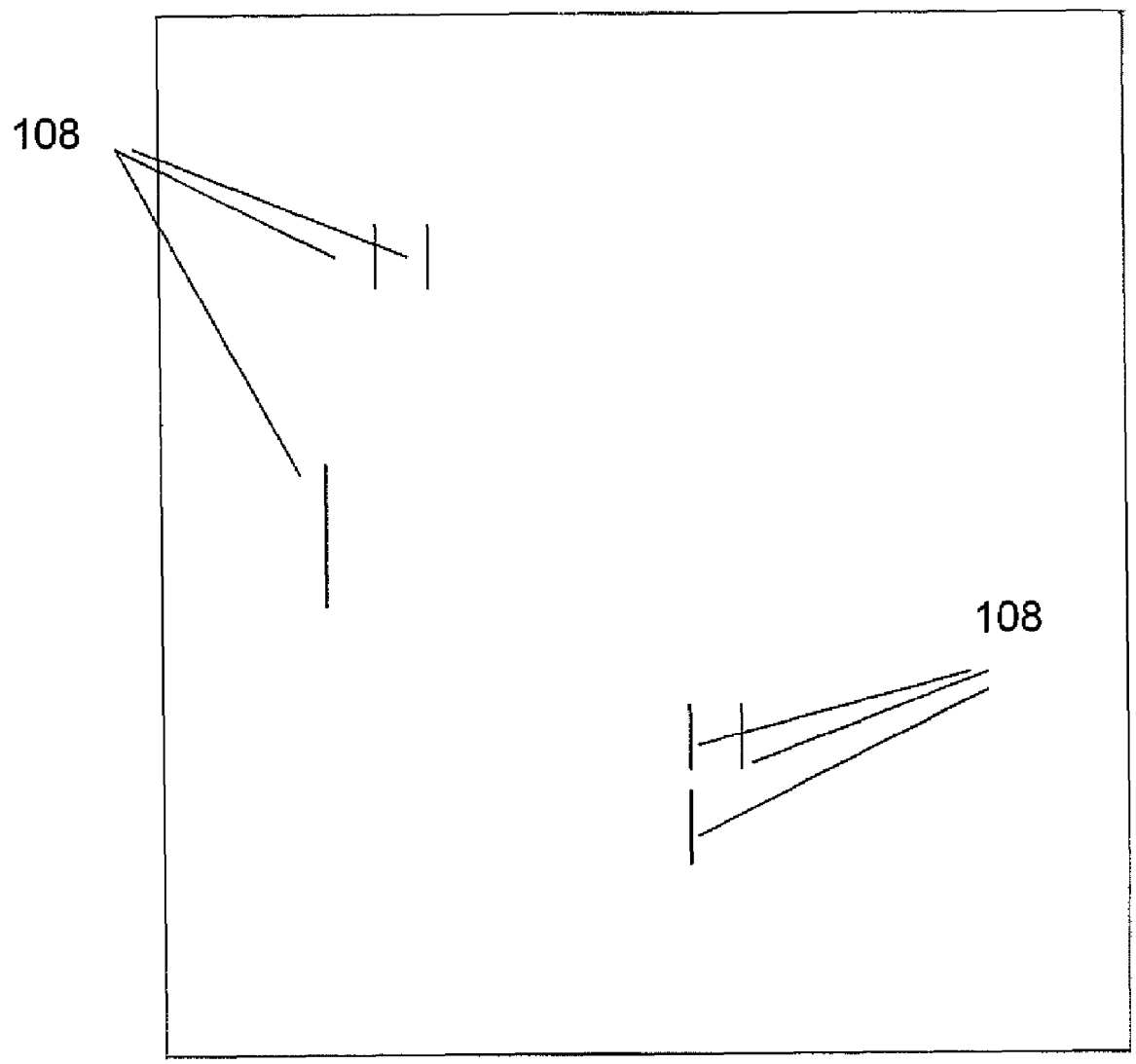
FIG. 7 shows potential problematic regions found by implementing aspects of the invention.

FIG. 7 shows potential regions of concern found by implementing aspects of the invention. Shapes 108 that are larger than a given threshold are identified as being potential problems and are chosen for further analysis. Those shapes that are within tolerance (less than or equal to a threshold value) are not included in the additional analysis, e.g., excluded from further analysis. In one illustrative implementation, the feature size is about 1.4 microns.

Figure 8A:
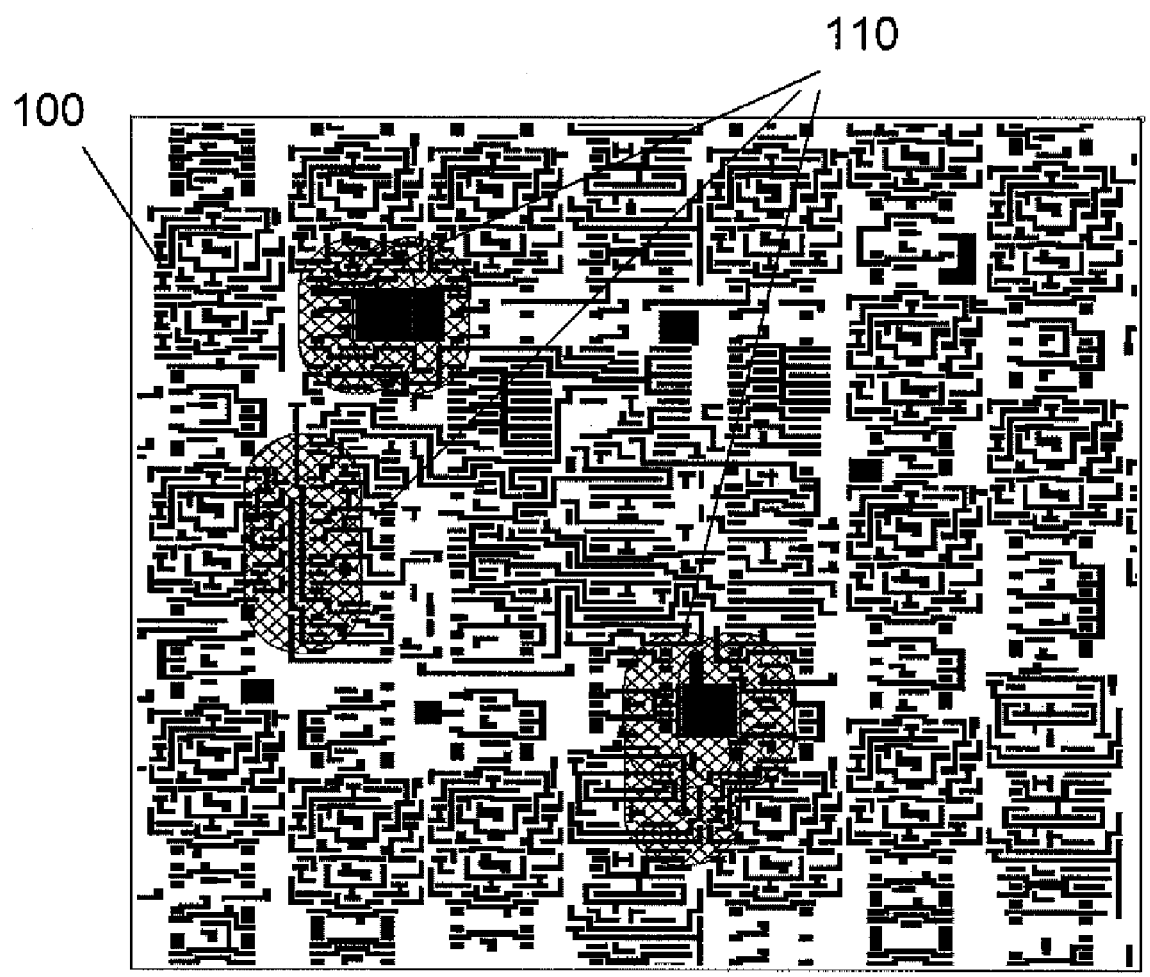
FIG. 8A shows the circuit of FIG. 2 with search regions as implemented in accordance with the invention.
Figure 8B:
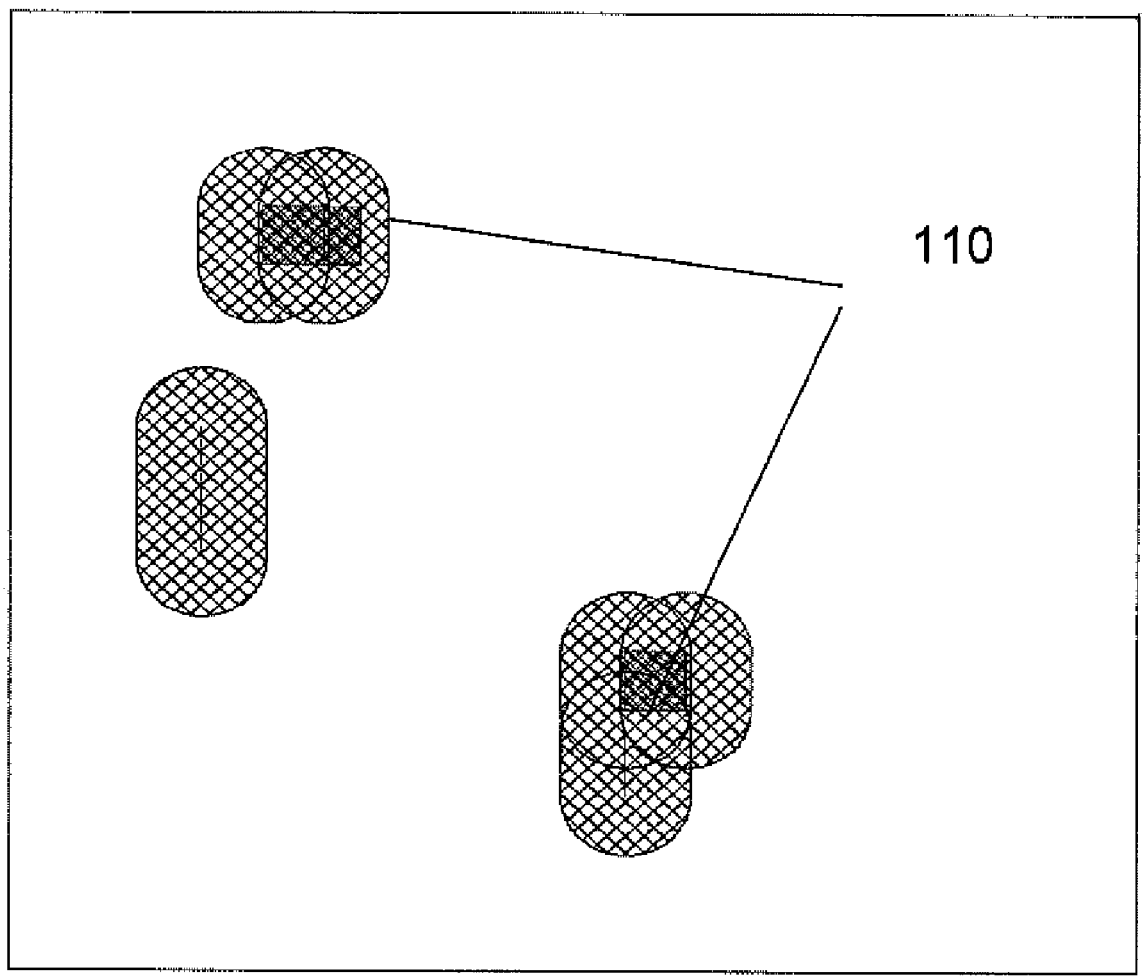
FIG. 8B shows the search regions of FIG. 8A.

FIG. 8A shows the circuit of FIG. 2 with search regions as implemented in accordance with the invention, and FIG. 8B shows the search regions of FIG. 8A. In FIGS. 8A and 8B, once the search regions are identified, the system and method may generate a rectangle, mesh regions 110 or other suitable marker around the potential problematic areas found by the search. FIG. 8B shows the search regions and the found problematic areas together. The meshes are the search regions and the rectangles the wide material found with the standard search and wide material methods.

Once identified, the results may be inputted into a known tool such as, for example, Cadence®. As should now be understood, once the problematic regions have been identified, the method and system selects the offending shape and uses that as a seed as a starting point or input for conducting standard wide wire (or other problem region) identification tests. Thus, it is now possible to isolate the regions of interest for future analysis, as shown representatively in the mesh regions 110.

Figure 9:
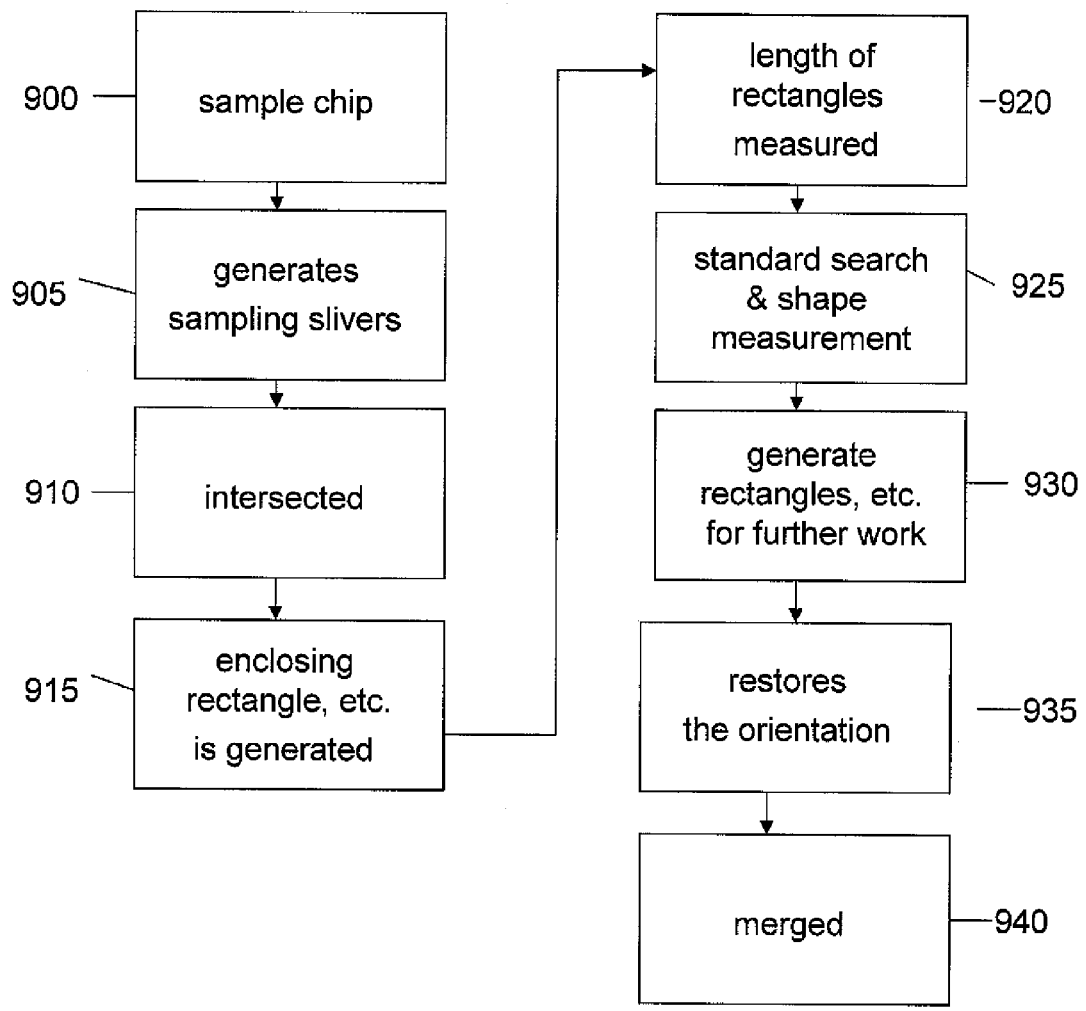
FIG. 9 is a flow diagram implementing steps of the invention.

FIG. 9 is a flow diagram implementing steps of the invention. FIG. 9 may equally represent a high-level block diagram of the invention. The steps of FIG. 9 may be implemented and executed from either a server, in a client server relationship, or they may run on a user workstation with operative information conveyed to the user workstation to create the navigation outlined above. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any system that can contain, store, communicate, propagate, or transport the program for use by or in connection with the instruction execution system, system, or device. The medium can be an electronic, magnetic, optical, electromagnetic, infrared, or semiconductor system (or system or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Referring back to FIG. 9, at step 900, a sample chip layout is provided to determine preferred wiring directions. Alternatively, a user can be queried for this information. At step 905, the system and method generates sampling slivers for each mask layer in question. These sampling slivers (or other shapes) can cover the chip or sub regions of the chip. In embodiments, the slivers are perpendicular to the preferred wiring direction for a mask layer, which are spaced at approximately (width in question)/1.5. In embodiments, the slivers can be very thin at just 4 design steps or so to be used to sample the layout design.

At step 910, the slivers are intersected with the mask layer. This intersection can be performed in parallel by bucketing the sampling slivers. Also, in embodiments, the search required looks only at touching shapes, i.e., in other words the region of interest is epsilon. At step 915, a rectangle or mesh is generated around the contiguous intersected regions (potential problematic areas), which may be performed step 910. In one implementation, a least enclosing rectangle or mesh is generated. No search is required for this operation.

At step 920, the length of these rectangles is measured and only those where the length is >=a threshold level, e.g., (width in question)/1.5, are kept. As should be recognized, other rectangle lengths can also be kept, depending on the defined parameters. Again, no search is required for this operation. At step 925, using these kept samples, standard techniques about the selected rectangles, etc. can then be implemented for determining wide regions using the samples as the basis for the search. Now, it is possible to do a search only where there is a possibility of wide material (or other problematic areas) and as importantly with only one seed for any search instead of a great many. At step 930, rectangles, markers or meshes, etc, can be generated for further work. At step 935, the system and method restores the orientation of layers reversing what was done in step 915 above. At step 940, the results are merged from step 935, and are inputted into one file for shaping to simplify the final result.

By utilizing the invention, many sub optimizations are possible, which result in additional (albeit somewhat minimal) improvements over the basic technique which yields huge improvements. Also, if the mask layout design has non-orthogonal (45 degree) data, the system and method of the invention can still be applied to such shapes. These shapes would be handled individually using traditional techniques for wide/fat region determination.

Thus, it should be understood by those of skill in the art that the invention provides an improved system and method of identifying areas of excess material (e.g. wide wires, devices, etc.) or minimal material (e.g. voids, open areas, unused areas) in a VLSI semiconductor mask layout. Thus, it should now be understood that the system and method of the invention has many advantages over the conventional methods because it identifies only the regions with potential problems and uses the identified seeds within each of those regions for launching further testing. This approach significantly reduces the resources and time required to perform the test over the previous methods.

While the invention has been described in terms of exemplary embodiments, those skilled in the art will recognize that the invention can be practiced with modifications and in the spirit and scope of the appended claims.

The invention claimed is:

1. A method of identifying areas in VLSI (very large scale integrated) layout comprising:
    defining one or more sliver sample area;
    overlaying the one or more sliver sample area onto at least a portion of a layout having a plurality of structures in a first direction; and
    identifying at least one region of the layout in the sliver sample area which has at least one structure of the plurality of structures which satisfies a predetermined value.

2. The method of claim 1, wherein the one or more sliver sample area is overlaid perpendicularly to the first direction of structures of the layout.

3. The method of claim 1, wherein the predetermined value is greater than or equal to a maximum threshold value.

4. The method of claim 1, further comprises excluding structures which are less than or equal to a minimum threshold value.

5. The method of claim 1, further inputting the at least one structure to a wide wire test.

6. The method of claim 1, wherein the plurality of structures includes at least one of a shape, cell, wire, block, n-well and p-well.

7. The method of claim 1, wherein the sliver sample area comprises at least one of a region, slice, and rectangle of a predetermined width and a spacing which is intersected with the layout.

8. The method of claim 1, wherein the identifying step identifies more than one region of the layout in the sliver sample area which has at least one structure of the plurality of structures which satisfies the predetermined value.

9. The method of claim 1, wherein the one or more sliver sample area is a discrete area over an entire layout.

10. The method of claim 1, wherein the sliver sample area is a plurality of slices spaced within a predefined feature size.

11. The method of claim 1, further comprising performing, in parallel, computations by bucketing the sliver sample area, which comprises a plurality of slivers some of which are oriented at least substantially perpendicular to layout features.

12. A method of determining problematic areas of a VLSI layout, comprising:
    generating at least one sampling sliver for each mask layer in question;
    overlaying the at least one sampling sliver over the each mask layer in question such that at least one of the sampling slivers are intersected with the mask layer in question; and
    obtaining a result from each generated sampling sliver, the result of each sampling sliver identifies whether a potential problematic area exists on the each mask layer.

13. The method of claim 12, further comprising merging the results from each sampling sliver which have identified potential problematic areas for analysis and inputting the merged results into a shape engine.

14. The method of claim 12, further comprising providing two or more sampling slivers and wherein the overlaying the two or more sampling slivers over the each mask layer in question such that at least one of the two or more sampling slivers are intersected with the mask layer in question is performed in parallel by bucketing.

15. The method of claim 12, further comprising enclosing a rectangle or mesh about contiguous intersected regions which are identified as potential problematic areas.

16. The method of claim 12, wherein:
    the at least one sampling sliver is substantially perpendicular to a wiring direction for the each mask layer in question and spacing between two of the slivers is approximately a (width in question)/1.5; and
    the at least one sliver is approximately 4 design steps in width.

17. The method of claim 12, further comprising increasing sampling speed with increased sampling size over a wide area.

18. A system comprising:
    means for defining one or more sliver sample area of a predetermined width and spacing, the spacing not to exceed a design parameter;
    means for overlaying the one or more sliver sample area onto at least a portion of a layout having a plurality of structures; and
    means for identifying at least one region of the layout in the sliver sample area which has at least one structure which satisfies a predetermined value.

19. The system of claim 18, further comprising a computer readable program implemented in a computer infrastructure on a computer program product comprising a computer useable medium including the computer readable program, wherein the computer readable program when executed on the computer infrastructure causes the computer infrastructure to implement the at least one of the means for defining, overlaying and identifying.

20. The system of claim 19, wherein:
    at least one of the one or more sliver sample area is overlaid perpendicularly to the first direction of structures of the layout;
    the predetermined value is greater than or equal to a maximum threshold value;
    the sliver sample area comprises at least one of a region, slice, and rectangle of a minimum width and spacing; and
    the means for identifying identifies more than one region of the layout in the sliver sample area which has at least one structure of the plurality of structures which satisfies the predetermined value.

* * * * *